United States Patent
Tsai et al.

(10) Patent No.: US 7,545,299 B2
(45) Date of Patent: Jun. 9, 2009

(54) ANALOG FRONT END DEVICE

(75) Inventors: Jui-Yuan Tsai, Tai Nan (TW); Chi-Kung Kuan, Ta Hsi Town (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 11/902,663

(22) Filed: Sep. 24, 2007

(65) Prior Publication Data

US 2008/0084338 A1    Apr. 10, 2008

(30) Foreign Application Priority Data

Sep. 25, 2006    (TW) ............................... 95135311 A

(51) Int. Cl.
    *H03M 1/62*    (2006.01)
(52) U.S. Cl. ...................... 341/139; 341/155
(58) Field of Classification Search ................ 341/155, 341/143, 142, 120, 118, 139
    See application file for complete search history.

(56) References Cited

U.S. PATENT DOCUMENTS

| 5,486,867 | A  | * | 1/1996  | Hsu et al. ................... 348/516 |
| 6,937,176 | B2 | * | 8/2005  | Freeman et al. ............. 341/143 |
| 7,304,679 | B1 | * | 12/2007 | Johnson et al. ........ 348/333.11 |
| 2008/0007656 | A1 | | 1/2008 | Tsai |
| 2008/0030584 | A1 | | 2/2008 | Tsai |
| 2008/0030620 | A1 | | 2/2008 | Tsai |
| 2008/0032658 | A1 | | 2/2008 | Tsai |

OTHER PUBLICATIONS

Analog Devices AD9985 110 MSPS/140 MSPS Analog Interface for Flat Panel Displays, 32 Pages (2004).
Analog Devices ADV7183A Multiformat SDTV Video Decoder, 104 pages (2004).

* cited by examiner

*Primary Examiner*—Brian Young
(74) *Attorney, Agent, or Firm*—Muncy, Geissler, Olds & Lowe, PLLC

(57) ABSTRACT

The invention discloses an analog front end device includes a calibration unit and at least a conversion circuit. The conversion circuit includes a clamper, a multiplexer, an voltage buffer and an analog to digital converter. The clamper receives an image signal and resets the DC voltage level of the image signal to generate a clamped signal. The multiplexer receives the clamped signal and a test signal and outputs the clamped signal or the test signal according to a selecting signal. The voltage buffer amplifies the clamped signal or the test signal to generate a buffer signal. The analog to digital converter converts the buffer signal into a digital signal. The calibration unit generates a gain correction value according to the test signal and calibrates the gain offset of the digital signal according to the gain correction value.

17 Claims, 6 Drawing Sheets

ANALOG FRONT END DEVICE

BACKGROUND OF THE INVENTION (a) Field of the Invention

The invention relates to a display system, particularly to an analog front end device of a display system.

(b) Description of the Related Art

Since the 20th century, the development of the television technology and its applications has proved that it is now part of human life and entertainment. Because of the improvement of display technology in recent years, providing massive information and high-definition images has become the guideline of future development of the television industry. Please refer to FIG. 1, showing a schematic diagram of a typical television system and its video signal data source. As shown in FIG. 1, the video signal data source system 110 transmits video data in analog signal format to a television system 120 for displaying a video picture. Although digitized transmission interfaces are already available, analog transmission interfaces remain the most commonly used form of interface.

The video signal data source of the television system 120 can have many forms, such as a DVD player, set top box, and even various game consoles. In general, the components of the video signal data source system 110 comprise a video encoder 112 for performing image data encoding. Then, a digital-to-analog converter (DAC) 114 converts the encoded digital signal into an image analog signal and transmits it.

The television system 120, such as a LCD TV or other flat panel television system or digital television system that is becoming the main stream application, receives an image analog signal transmitted from the video signal data source, converts it into digital format via an analog-to-digital converter (ADC) 124, and performs decoding operation via a video decoder 122 for further image processing and displaying.

There are many types of video encoding formats. The widely seen ones are: RGB format, CVBS format, luminance/chrominance (YC) format, and YPrPb format. Therefore, the analog transmission interface for transmitting video signals between the video source system 110 and the television system 120 can also have several types, such as AV interface for transmitting a signal in CVBS format; S-video interface for transmitting a signal in YC format; and component video interface for transmitting a signal in YPrPb format, etc.

In general, inside an integrated circuit (IC) of the television system 120, a digital circuit and an analog circuit are both included. The digital circuit does not generate offset phenomenon because of the circuit design or influence from manufacturing process, while the analog circuit suffers from the influence of the above-mentioned factors and generates offset or variation, resulting in absolute accuracy distortion phenomenon of the analog-to-digital converter of a single channel or circuit mismatch phenomenon between a plurality of analog-to-digital converters of different channels (for example, between the analog-to-digital converters of the three RGB channels). The factors causing the above-mentioned phenomena comprise the signal gain and offset.

Subsequently, the above-mentioned phenomena will be explained by using the solid line portion of the schematic diagrams illustrated in FIGS. 2 and 3 that show the transfer function of a 2-bit analog-to-digital converter. As shown in FIG. 2, the slope of the dotted line S1 represents a gain value between output and input signal waveform of the analog-to-digital converter. FIG. 2 shows an ideal transfer function of an analog-to-digital converter in which the dotted line S1 passes through the origin of the coordinate axes with slope of 1, representing the offset of the analog-to-digital conversion is equal to zero and the gain of the analog-to-digital conversion is equal to 1. However, the analog-to-digital converter, in reality, cannot achieve the ideal characteristic of an analog-to-digital converter due to imperfect factors, such as process variations. The schematic diagram (solid line portion) illustrated in FIG. 3 shows a practical transfer function of an analog-to-digital converter in which the slope of the dotted line S1 represents the gain value between the output and input signal waveform of an analog-to-digital converter. The dotted line S1 shown in FIG. 3 does not pass the origin of the coordinate axes and the slope is not 1 (it is more than 1, as shown in FIG. 3), representing that the analog-to-digital conversion has offset and the gain is not 1, like the ideal value.

The above-mentioned imperfect characteristic of the analog-to-digital converter causes the deviations of both the transfer function of the analog-to-digital converter and the absolute accuracy from the expectation in the beginning of the design, resulting in the absolute accuracy distortion of the signal of the single channel. In a multi-channel display system, such as an original color image display system that has the R,G, B three channels, the mismatch phenomenon between channels arises due to the difference between channels. For example, in a typical display system with R, G, B three channels that use 8-bit to represent a color value, if the input signal is a gray scale (that is the input value of the three channels are the same), due to the above-mentioned channel mismatch resulting from the imperfect characteristic of the analog-to-digital converter, the digital value generated by each channel may not be the same and thus the color shift phenomenon may be generated.

Although the offset phenomenon generated by the analog-to-digital conversion can be calibrated by the black level transmitted during the porch interval, there is no effective solution for the imperfect characteristic of the gain, as mentioned in the above.

BRIEF SUMMARY OF THE INVENTION

In light of the above mentioned problem, one object of the invention is to provide an analog front end device that can properly adjust the absolute gain value of an analog front end device for solving the above-mentioned problem.

Another object of the invention is to provide an analog front end device that can properly adjust the gain difference between a plurality of channels of the analog front end device for solving the above-mentioned problem.

In order to achieve the above-mentioned objects, an analog front end device according to one embodiment of the invention comprising at least a conversion circuit and a calibration unit is provided. The conversion circuit comprises a clamper, a multiplexer, an voltage buffer, and an analog-to-digital converter. The clamper receives an image signal, resets DC voltage level of the image signal, and generates a clamped signal. The multiplexer receives the clamped signal and a test signal and outputs the clamped signal or the test signal according to a selecting signal. Furthermore, the voltage buffer buffers the clamped signal or the test signal to generate a buffer signal. The analog-to-digital converter converts the buffer signal into a digital signal. The calibration unit generates a gain correction value according to the test signal and uses the gain correction value to calibrate the gain value of the digital signal.

The analog front end device in one embodiment of the invention uses the calibration unit to correct the gain of the digital signal so as to increase the gain absolute accuracy of a single gain or each individual gain for a plurality of conversion circuits, or to make the relative gain between a plurality of conversion circuits be equal. Thus, the original digital signal value that is supposed to be outputted is not changed due to the gain absolute accuracy distortion or the gain mismatch phenomenon among the conversion circuits, that is caused by the influence of the environmental factors. Therefore, the conversion circuit gain mismatch problem in the prior art can be solved and the color shift phenomenon of the display system is eliminated to achieve the increase of display quality.

DETAILED DESCRIPTION OF THE INVENTION

Before the description of the embodiment of the invention, it should be noted that the display system described in the following embodiments has a plurality of channels (usually, three channels, such as the R, G, and B channels) in order to solve the channel mismatch problem. However, based on the technical content disclosed in the invention, those who are skilled in the art should be able to understand that the invention is not limited to this application area. Even if it is only applied to one single channel among a plurality of channels, the technique of the invention can still solve the problem of a single channel, like the absolute accuracy distortion.

Figure 1:
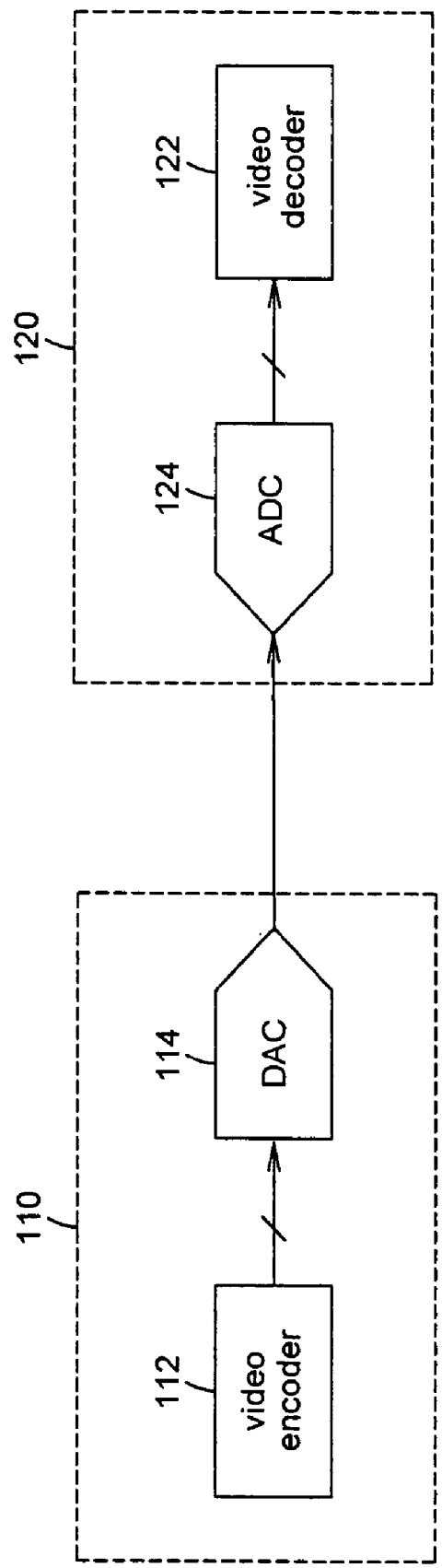
FIG. 1 shows a schematic diagram illustrating the television system and its video signal data source according to the prior art.
Figure 2:
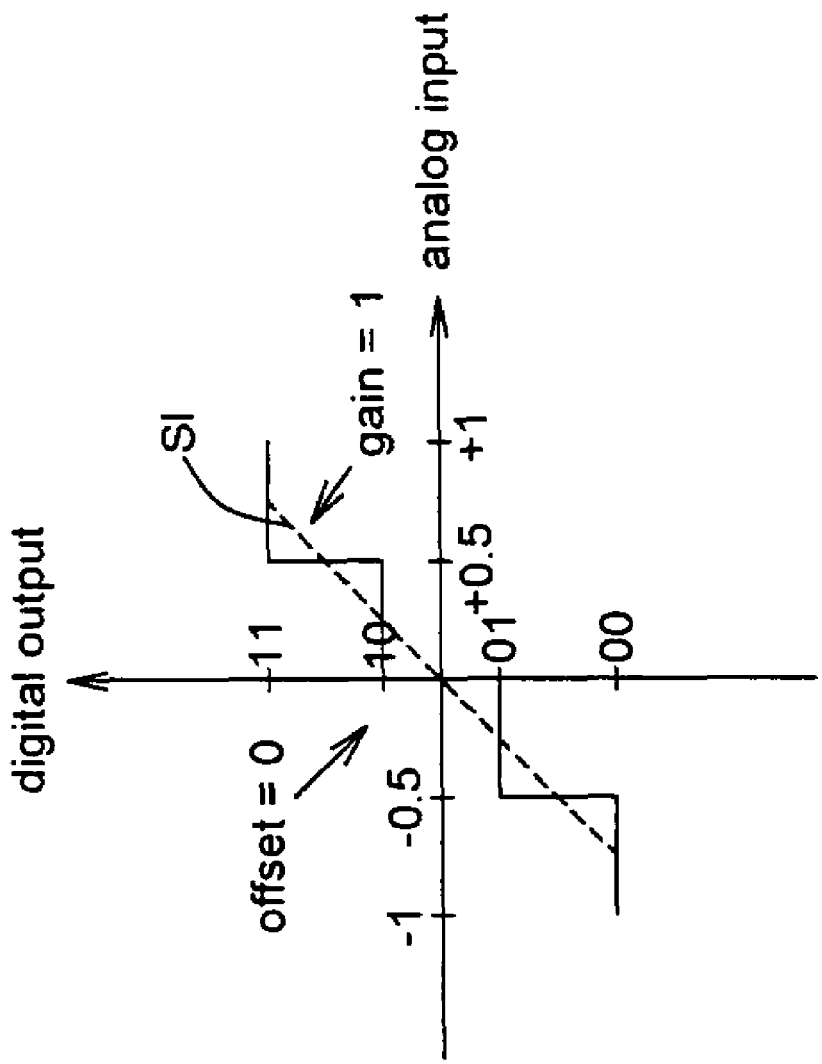
FIG. 2 shows an ideal input and output waveform of the analog-to-digital converter in the traditional analog front end device.
Figure 3:
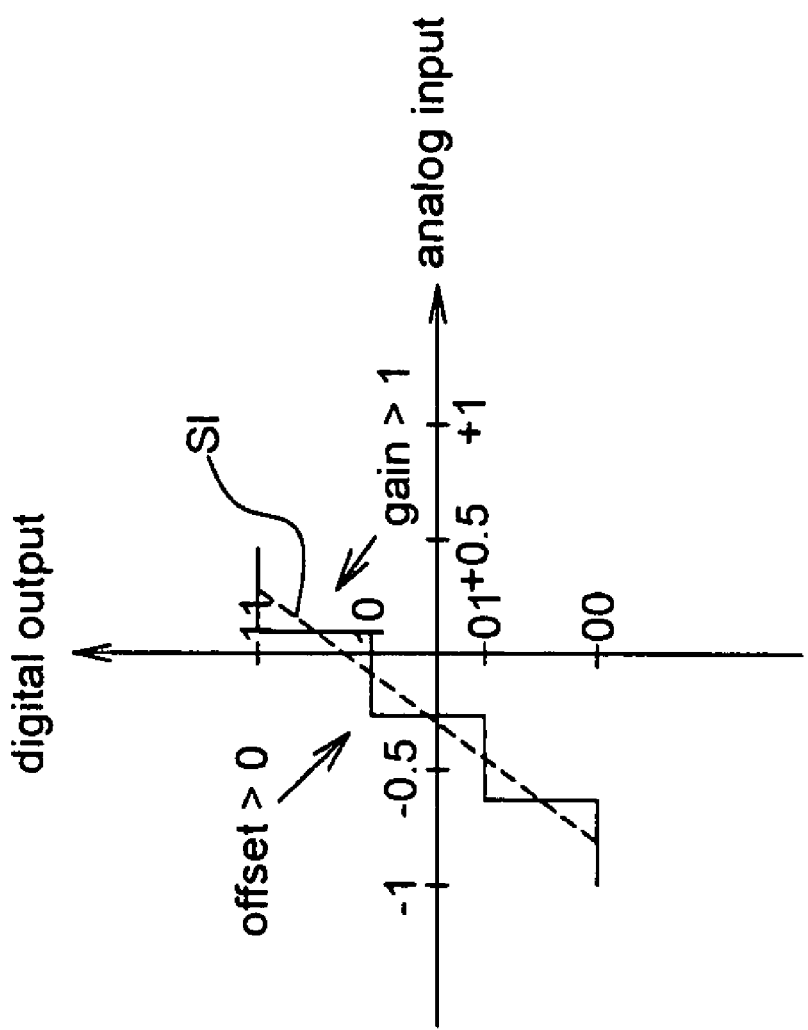
FIG. 3 shows a practical input and output waveform of the analog-to-digital converter in the traditional analog front end device.
Figure 4:
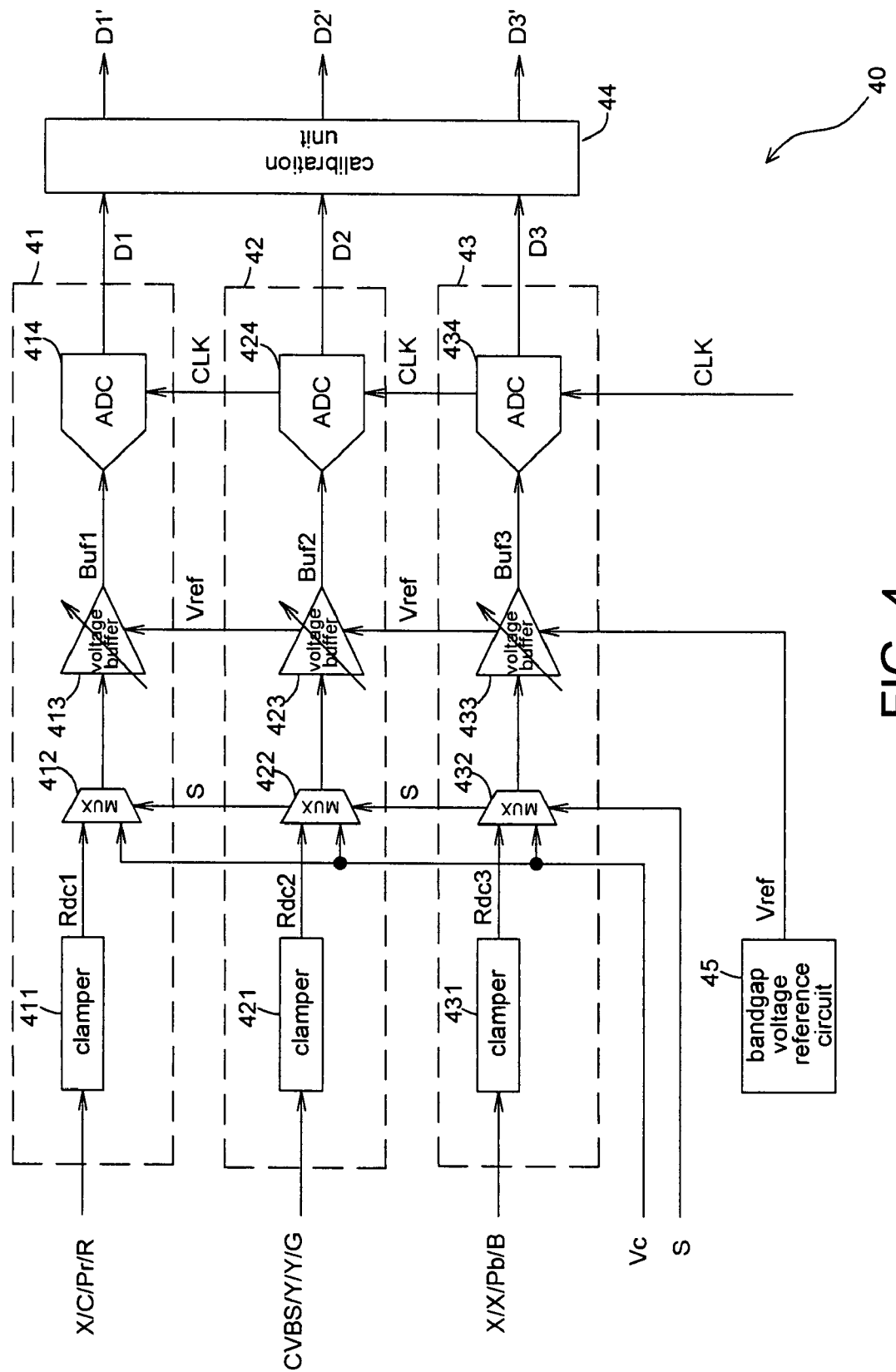
FIG. 4 shows a schematic diagram illustrating an analog front end device according to one embodiment of the invention.

FIG. 4 shows a schematic diagram illustrating an analog front end device 40 applied in a television system 120 according to one embodiment of the invention. In one embodiment of the invention, a digital-to-analog converter 114 in a video data source system 110 outputs an image analog signal and transmits it to the analog front end device 40 through a transmission medium (not shown in the figure). Then, the analog front end device 40 processes the signal and outputs it to a video decoder 122 for decoding. In one embodiment of the invention, the format of the image analog signal comprises an image data component, such as a RGB signal, a CVBS signal, a YC signal, a YPrPb signal and the like. However, applications of the invention are not limited by these examples. Any existing video format or future format to be developed can also apply the concept of the invention. Although the above-mentioned embodiment is illustrated by using a television system as an image broadcasting device, the invention is not limited by this example.

On the other hand, it can be understood for those who are skilled in the image processing technology that the above-mentioned transmission medium can be implemented by wired (such as cable or the like), wireless (such as radio frequency antenna or the like), or various existing or innovative methods. In this embodiment, the transmission medium is implemented by a cable (that is, a wired method) conforming to the above-mentioned signal format.

The analog front end device 40 comprises a first conversion circuit 41, a second conversion circuit 42, a third conversion circuit 43, a calibration unit 44, and a bandgap voltage reference circuit 45. The first conversion circuit 41 comprises a clamper 411, a multiplexer 412, an voltage buffer 413, and an analog-to-digital converter 414. As shown in the figure, the structures of the three conversion circuits 41, 42, and 43 are the same. Further details about the conversion circuits 42 and 43 will not be repeated hereinafter. On the other hand, the analog-to-digital converters 414, 424, and 434 receive a pixel clock signal CLK for sampling while the analog front end device 40 is in operation. At the same time, the bandgap voltage reference circuit 45 generates a reference voltage $V_{ref}$, provides the reference voltage $V_{ref}$ to the voltage buffers 413, 423, and 433, uses the reference voltage $V_{ref}$ to adjust gains and offset voltages of the voltage buffer 413, 423, and 433. The analog front end device 40 receives the image analog signal, comprising N (N is a positive integer and N is larger than 1) image signals, such as the above-mentioned RGB signal, YC signal, and YPrPb signal. The analog front end device 40 converts the image signal into N digital signals. That is to say, when receiving the image analog signal that comprises three image signals, like the original color image signal (R, G, B), or an image color difference signal (Y, Pr, Pb), the above-mentioned N is equal to 3 and thus the analog front end device 40 needs three identical conversion circuits 41, 42, and 43. If it is assumed that the analog front end device 40 receives a luminance chrominance signal (Y, C) that comprises two image signals, the above-mentioned N is equal to 2 and thus the analog front end device 40 is designed to have only two required conversion circuits 42 and 41.

The analog front end device 40 of the invention operates in two modes, one is a calibration mode and the other is a general mode. For simplicity, a RGB signal will be used in the following as an example to describe the analog front end device 40 operating with the above-mentioned two modes.

1. Calibration Mode:

The calibration mode is accomplished during the start-up time of the television system 120, or during the time that user switches display mode, such as switching refresh rate, or any other time that will not influence the quality of signal receiving. The principle of the calibration mode is as follows. The television system 120 uses the selecting signal S to interrupt the video signal processing of the video signal received by the analog front end device 40. A test signal Vc is provided to the conversion circuits 41, 42, and 43, at the same time so as to provide the same input signal for the analog-to-digital converters 414, 424, and 434. The calibration unit 44 is used to detect digital signals D1, D2, and D3 converted by the three analog-to-digital converters 414, 424, and 434. The current gains of the conversion circuit 41, 42, and 43 and the gain variation values between the current gain value and the original pre-determined target gain value of each conversion circuit 41, 42, and 43 are calculated. The required gain correction value of each conversion circuit according to the gain variation values is calculated. Thus, each conversion circuit is compensated. Finally, the calibration unit 44 outputs three corrected digital signals D1', D2', and D3'.

In general, the required calibration time during the calibration mode is very short and will not influence the normal signal receiving of the television system 120. The following example illustrates the operation of the analog front end device 40 in calibration mode.

After the conversion circuits 41, 42, and 43 receive the R, G, B three image signals, respectively, they use the clampers 411, 421, and 431 to perform calibration of the DC voltage level of these signals and generate clamped signals Rdc1, Rdc2, and Rdc3. Then, the multiplexers 412, 422, and 432 receive the clamped signals Rdc1, Rdc2, and Rdc3 respectively and receive the test signal Vc at the same time. The multiplexers 412, 422, and 432 select outputting the test signal Vc according to the selecting signal S which is set in calibration mode. The voltage buffer 413, 423, and 433 perform a buffering process on the three identical test signals Vc. Generally, an amplification process for signals Vc is carried out and the buffered output signals Buf1, Buf2, and Buf3 are generated. Then, the analog-to-digital converters 414, 424, and 434 convert the buffered output signals Buf1, Buf2, and Buf3 into three digital signals D1, D2, and D3. Since the three test signals Vc are the same, the overall gain value of each conversion circuit is the same. Therefore, the digital values of the digital signals D1, D2, and D3 after the final conversion should also be the same. However, if the gain of any (or more than one) circuit path in the conversion circuits 41, 42, and 43 is influenced by the environment, the deviation (absolute accuracy distortion) from the pre-determined target gain value is generated. Furthermore, mismatch phenomenon is generated between the conversion circuits 41, 42, and 43, resulting in the unequal digital values of the digital signals D1, D2, and D3 finally generated by the analog-to-digital converters 414, 424, and 434.

For example, it is assumed that the three analog-to-digital converters 414, 424, and 434 have the same 8-bit specification, the test signal Vc is at 0.9V, and the overall gain multiplication of each of the three conversion circuits 41, 42, and 43 is equal to one. If the gains of the conversion circuits are not influenced by the environment factor in a normal condition, under the condition of the test signal Vc equals to 0.9V, the digital values of the digital signals D1, D2, and D3 generated by the three conversion circuits 41, 42, and 43 must be equal to 250. However, if the characteristics of the analog-to-digital converters 414, 424, and 434 or other component of the conversion circuit are influenced by the environment factors, the gain of the conversion circuit is changed and subsequently signal mismatch between the conversion circuit paths occurs. Then, the digital values of the three digital signals D1, D2, and D3 generated by the three conversion circuits 41, 42, and 43 may become: D1=250, D2=240, and D3=230. Under the calibration mode, the analog front end device 40 according to one embodiment of the invention uses the calibration unit 44 to calibrate the digital signals D1, D2, and D3. The calibration method can be divided into two types. (1) The first method performs calibration on the gain absolute accuracy of each conversion circuit, adjusts the gain of each conversion circuit back to the pre-determined target gain value (also called absolute target gain value). Of course, under normal setting, the target gain values of the three conversion circuits are set to be equal. Therefore, gain mismatch between the conversion circuits can be avoided by this method. (2) The second method performs calibration on the gain relative accuracy of the three conversion circuits, that is, the three conversion circuits perform calibration simultaneously so that the gains of the three conversion circuits become the same and all equal to the identical relative target gain value. Therefore, the gain mismatch problem between the three conversion circuits is also solved.

When applying the first method, the calibration unit 44 performs calibration on the conversion circuit according to the pre-determined target gain value of each conversion circuit. The distorted gain value is calibrated back to the target gain value. For example, when the conversion circuit 42 receives the 0.9V test signal Vc under the normal condition, the digital value of its output digital signal D2 should be equal to 250. However, under the influence of the environment factor, the digital value of its output digital signal D2 becomes 240, that is, the distortion of the gain absolute accuracy occurs. Therefore, the calibration unit 44 determines the difference between the current gain value and the target gain value of the conversion circuit according to the two values and thus calculates a gain correction value. The calibration unit 44 stores the gain correction value. Then, in the general mode, the calibration unit 44 corrects the output signal of the conversion circuit 42 according to this gain correction value and adjusts the overall circuit path gain of the conversion circuit 42 back to the pre-determined target gain value. Therefore, the calibration unit 44 can calibrate the deviation of the output digital signal of the conversion circuit 42 while the image signal is inputted. Similarly, when the gains of the conversion circuits 41 and 43 are adjusted back to the same target gain value of the conversion circuit 42, the three conversion circuits recover their absolute accuracy and the mismatch problem between the three conversion circuits no longer exists.

When applying the second method, the calibration unit 44 uses the digital value of the digital signal of any conversion circuit as the reference value, determines the gain difference between that conversion circuit and the other two conversion circuits according to the difference between the reference value and the other digital signals, and performs relative gain adjustment on the other conversion circuits so that the gain is adjusted to the common relative target gain value of the three conversion circuits. For example, if the digital signal D2=240 is used as the reference value to determine the gain correction value of the other digital signals D1 and D3, the digital values of the three digital signal D1, D2, and D3 becomes equal under the same input voltage 0.9V and the gains of the three conversion circuits are matched. Thus, the corrected digital signals D1', D2', and D3' that have the identical digital value of 240 are generated and the calibration unit 44 stores the plurality of gain correction values. Thereafter, in the general mode, the calibration unit 44 corrects the output digital signals of the three circuit paths according to the gain correction values of the three conversion circuits, adjusts the gains of the three conversion circuits to be relatively equal. Therefore, when the image signal is inputted, the three deviations of the digital signals can be calibrated to have the digital values of the three digital signals be the same. Thus, the gain mismatch problem between the conversion circuits is solved.

The relationships between the corrected digital signals D1', D2', and D3' and the digital signals D1, D2, and D3 when applying the second method are as follows:

$$D1'=D1 \times Cr1=250 \times (240/250)=240;$$

$$D2'=D2 \times Cr2=240 \times 1=240; \text{ and}$$

$$D3'=D3 \times Cr3=230 \times (240/230)=240.$$

Therefore, the overall gain correction value Cr1 of the first conversion circuit 41 is equal to 24/25; the overall gain correction value Cr2 of the second conversion circuit 42 is equal to 1; and the overall gain correction value Cr3 of the third conversion circuit 43 is equal to 24/23. Of course, the gain correction value of the conversion circuit can be obtained based on the digital value of any digital signal that is outputted from the three conversion circuits 41, 42, and 43. For example, the value 230 of the digital signal D3 can be used as the reference as long as the gains of the three conversion circuits 41, 42, and 43 are corrected to the same value.

It should be noted that in one embodiment of the invention the analog front end device 40 according to the invention calculates the absolute or relative gain correction value, during every start-up of the television system 120, for correcting the gain absolute accuracy of every single conversion circuit 41, 42, or 43 or the gain mismatch between the three conversion circuits 41, 42, and 43, but the same gain correction value may not be used over a long period of time. The reason is that the gain deviations of the conversion circuits 41, 42, and 43 are apt to be changed after a long period of time, due to the influence of system temperature, frequency drift of the clock generator or other environment factors. The original effect of the gain corrections may be reduced or even failed. Therefore, besides the start-up time, the analog front end device 40 according to one embodiment of the invention enters the calibration mode automatically by interrupting the general mode, during the other above-mentioned period that can be used to perform adjustment, either at any suitable time or according to the setting of the designer, to re-calculate a new gain correction value. The signal receiving quality of the television system 120 can be increased, when the system operating time is extended, by automatically adjusting the gain variations induced by the plurality of variations. In another embodiment, the above-mentioned calibration function is not even executed during the system starts up but the calibration is randomly performed during any other suitable time.

2. General Mode:

After a television system 120 starts up or completes the calibration mode under other conditions or timing, the analog front end device 40 enters the general mode. The conversion circuits 41, 42, and 43 receive R, G, B three image signals, respectively. The clampers 411, 421, and 431 are used to perform calibration of the DC voltage level of the plurality of signals, respectively. The clamped signals Rdc1, Rdc2, and Rdc3 are generated. Then, the multiplexers 412, 422, and 432 receive the clamped signals Rdc1, Rdc2, and Rdc3, respectively, and a test signal Vc. Since it is in the general mode, the multiplexers 411, 421, and 431 selectively output the clamped signals Rdc1, Rdc2, and Rdc3 according to a selecting signal S in general mode. Then, the voltage buffers 413, 423, and 433 perform buffering process on the clamped signals Rdc1, Rdc2, and Rdc3 respectively and thus generate buffered output signals Buf1, Buf2, and Buf3. Then, the analog-to-digital converters 414, 424, and 434 convert the buffered output signals Buf1, Buf2, and Buf3 into the digital signals D1, D2, and D3, respectively. It should be noted that the digital values of the three digital signals D1, D2, and D3 can be influenced by the gain variation (absolute accuracy distortion) of the conversion circuits 41, 42, and 43. Finally, the calibration unit 44 utilizes the gain correction values stored during the above-mentioned calibration mode, such as Cr1, Cr2, and Cr3, to adjust the gains of the digital signals D1, D2, and D3 to an absolute target gain value of every conversion circuit or a relative target gain value between the conversion circuits for generating corrected digital signals D1', D2', and D3'. Therefore, when the three R, G, B image signals are inputted, the calibration circuit 44 is used to correct the gains of the digital signals D1, D2, and D3 so that the overall gains of the conversion circuits 41, 42, and 43 become absolutely or relatively equal. Thus, the gain mismatch between the three conversion circuits can be avoided. Hence, the analog front end device 40 according to the invention can solve the gain mismatch problem in the prior art, eliminate the distortion of the television system, and achieve the increase of the display quality.

Of course, although only one test signal value of 0.9V is used to acquire the digital value of the digital signal for performing gain calibration process in the above-mentioned embodiment, another embodiment of the invention utilizes a plurality of test signals Vc for performing calibration. For example, 0.9V, 0.6V, and 0.3V are used as the test signals Vc, simultaneously or separately, to acquire three digital values of the digital signals for determining an absolute gain correction value of each conversion circuit corresponding to each voltage level or an relative gain correction value between the conversion circuits. Interpolation is thus carried out to achieve higher level and more accurate gain correction effect.

Figure 5:
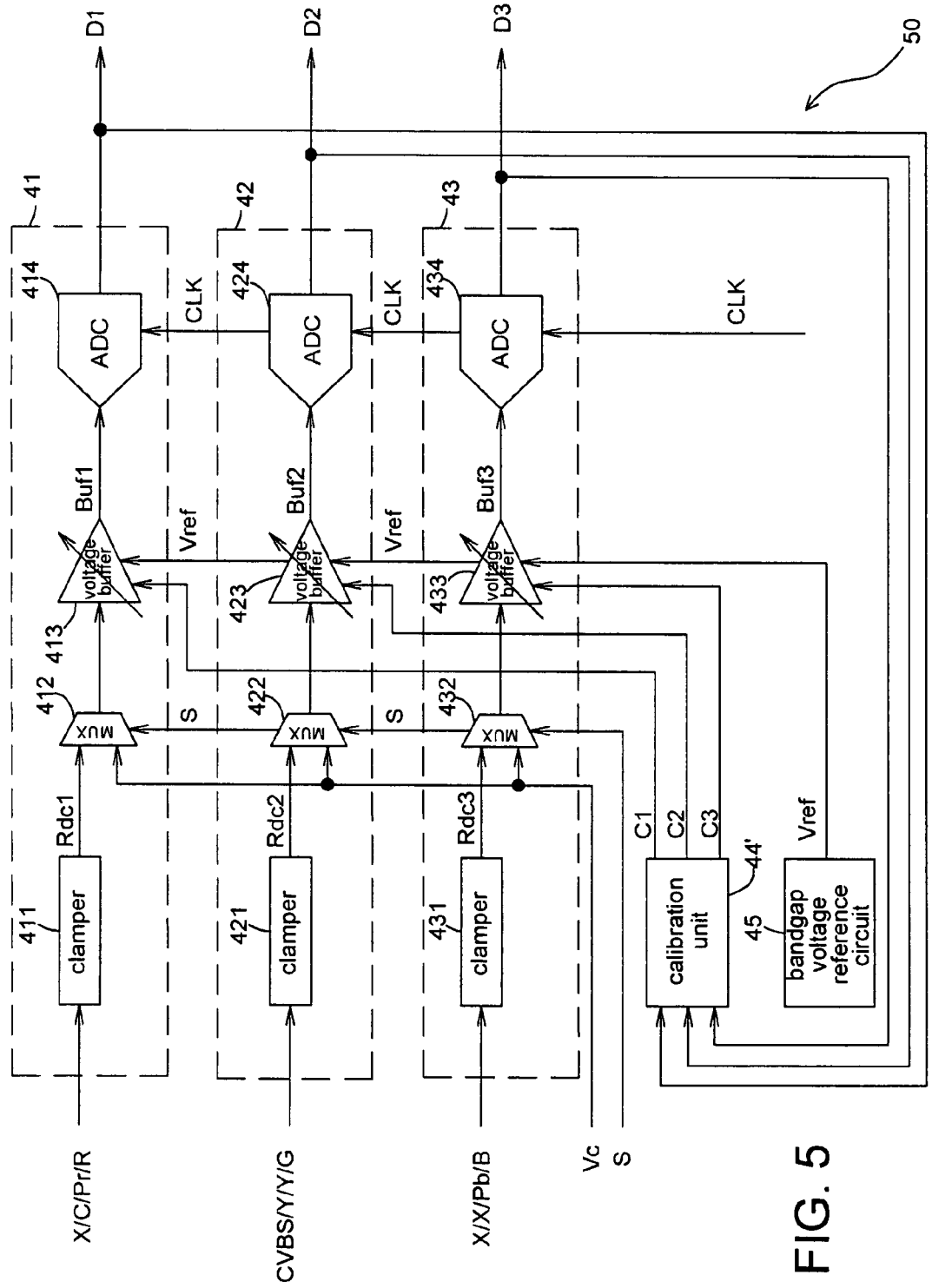
FIG. 5 shows a schematic diagram illustrating an analog front end device according to another embodiment of the invention.

FIG. 5 shows a schematic diagram illustrating an analog front end device according to another embodiment of the invention. The analog front end device 50 comprises a first conversion circuit 41, a second conversion circuit 42, a third conversion circuit 43, a calibration unit 44', and a bandgap voltage reference circuit 45. The structure and operation method of the analog front end device 50 are almost the same as the analog front end device 40 as shown in FIG. 4. The difference is that the calibration unit 44' of the analog front end device 50 uses the absolute gain correction value or the relative gain correction value of each above-mentioned circuit path to generate three different control signals C1, C2, and C3 with different amplitude for adjusting the gains of the three voltage buffers 413, 423, and 433. Thereby, the gains of the three conversion circuit are adjusted to the absolute or relative target gain value so as to achieve the effect of calibrating the gain deviations of the three digital signals D1, D2, and D3. Hence, the analog front end device 50 can also solve the gain mismatch problem between the conversion circuits 41, 42, and 43.

Figure 6:
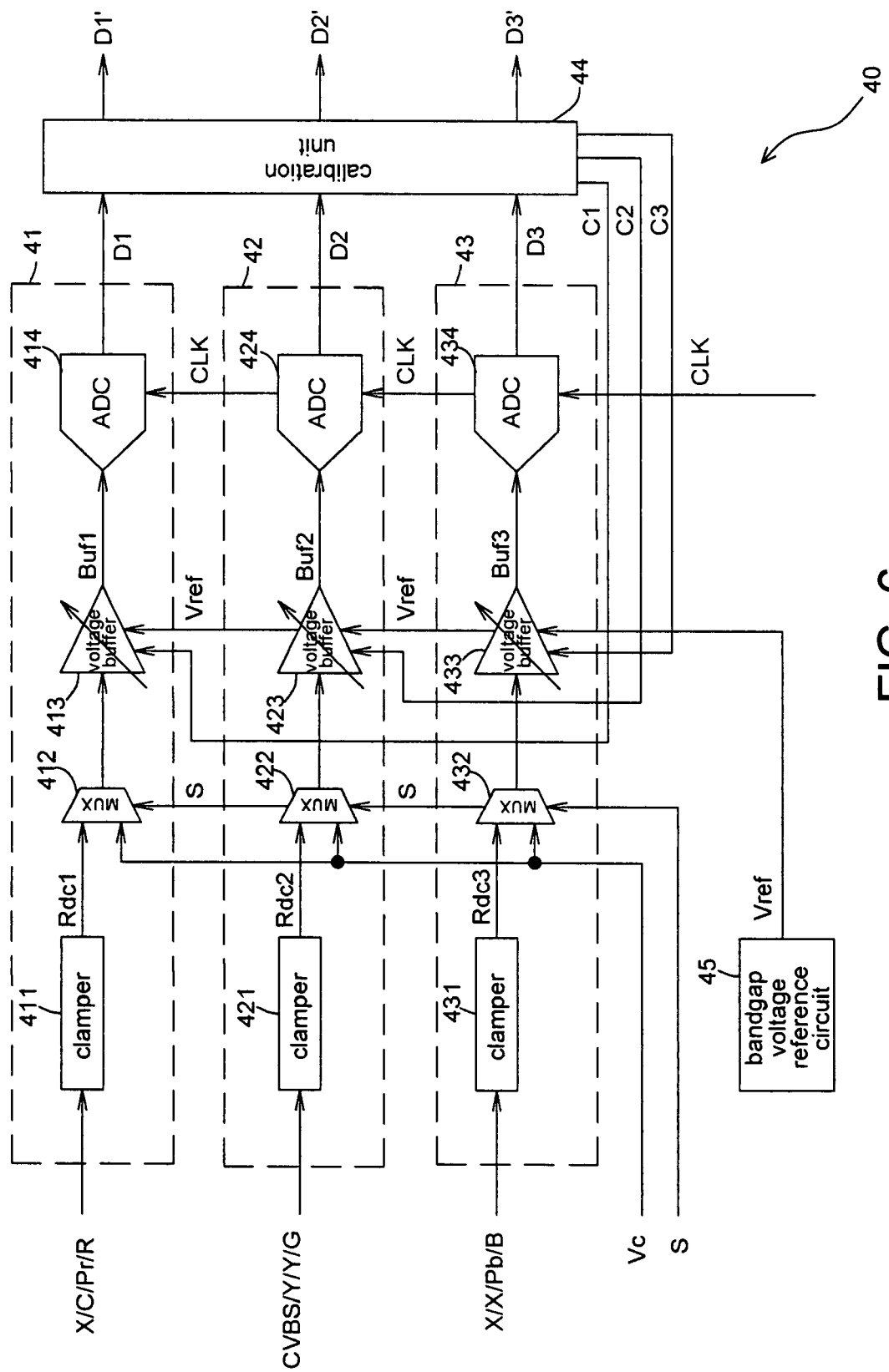
FIG. 6 shows a schematic diagram illustrating an analog front end device according to another embodiment of the invention.

Of course, as shown in FIG. 6, at the same time that the analog front end device 40, as shown in FIG. 4, utilizes the absolute or relative gain correction value to correct digital signals D1, D2, and D3, the absolute or relative gain correction value is also used to generate different control signals C1, C2, and C3, separately. Moreover, the gain values of the three voltage buffers 413, 423, and 433 are adjusted in accord with the calibration of the calibration unit 44 so that the overall gains of the three conversion circuits 41, 42, and 43 are adjusted to the same value and the gain mismatch problem between the conversion circuits 41, 42, and 43 is solved. Adjusting the calibration unit and the control of the voltage buffers can be controlled by coarse adjustment and relatively fine adjustment according to the requirements of the designer so as to achieve more precise calibration effect.

It should be noted that all the calibration units in the above-mentioned embodiments utilize an off-line method to interrupt the original operation of the circuit, that is, the gain calibration between the circuit paths is performed under the calibration mode. However, the invention is not limited by this method. In another embodiment of the invention, the calibration unit can also operate by an on-line method, that is, for an image signal comprising SYNC pattern (such as a G signal of a SOG (SYNC On Green) image signal or a Y signal of a YPrPb signal), the porch interval (there will be no actual image signal inputting during this time period) of the voltage level variation of the SYNC pattern (for example, the −300 mV variation in the SYNC pattern of the Y signal) is utilized to perform the gain value calculation of the above-mentioned calibration mode and perform real time gain calibration process during the other image display interval. By this method, the system operation will not be interrupted and the signal receiving of the television system will not be affected by performing the calibration of the conversion circuit(s).

It should be noted that the calibration unit of the analog front end devices 40 and 50 according to the invention can be implemented by one selected from the group consisting of the following: software, firmware, hardware and any combination thereof, but it is not limited to a fixed method. Furthermore, the test signal Vc and the selecting signal S of the invention are provided by the television system. In another embodiment of the invention, the test signal Vc and the selecting signal S can be provided by the calibration unit 44, (44'). Although the discussion of the analog front end devices 40 and 50 according to the invention is based on three identical conversion circuits to solve the gain absolute accuracy and mismatch problems of the three conversion circuits, the calibration technique of the invention is not limited to solve the problem in the case of three conversion circuits. Mismatch problem in the case of more than two (including two) conversion circuits can also be solved by using the calibration technique of the invention. Even the gain absolute accuracy variation problem of a single conversion circuit can also be solved.

Although the present invention has been fully described by way of examples with reference to the accompanying drawings, it should not be construed as any limitation on the scope of the present invention and various modifications and changes can be made by those who are skilled in the art without deviating from the essence of the invention.

What is claimed is:

1. An analog front end device, comprising:
   a clamper, receiving an image signal, for clamping DC level of the image signal and generating a clamped signal;
   a multiplexer, receiving the clamped signal and a test signal, for selectively outputting the clamped signal or the test signal according to a selecting signal;
   an voltage buffer, for buffering the clamped signal or the test signal and generating a buffered output signal;
   an analog-to-digital converter, for performing analog to digital conversion on the buffered output signal to generate a digital signal; and
   an calibration unit, for estimating a gain correction value according to the test signal and the digital signal so as to calibrate the gain value of the digital signals,
   wherein the image signal is an original color image signal (R,G,B), an image color difference signal (Y,Pr,Pb), or a luminance chrominance signal (Y,C).

2. The analog front end device according to claim 1, wherein the calibration unit receives the digital signal while the multiplexer selects the test signal for output; calculates the gain correction value according to a target gain value that is corresponding to the test signal and the current gain of the digital signal; and uses the gain correction value to correct the digital signal while the multiplexer selects the clamped signal for output.

3. The analog front end device according to claim 1, wherein the calibration unit utilizes the gain correction value to generate a control signal for adjusting a gain of the voltage buffer.

4. The analog front end device according to claim 1, wherein the calibration unit is implemented by software, firmware, hardware or any combination thereof.

5. An analog front end device, comprising:
   a clamper, receiving an image signal, for clamping the DC level of the image signal, and generating a clamped signal;
   an voltage buffer, for buffering the clamped signal or a test signal to generate a buffered output signal;
   an analog-to-digital converter, for performing analog to digital conversion on the buffered output signal to generate a digital signal; and
   a calibration unit calculates a gain correction value according to a target gain value that is corresponding to the test signal and the current gain of the digital signal during channel time of the sync pattern of the image signal; and utilizes the gain correction value to correct the gain value of the digital signal during image displaying time of the image signal,
   wherein the image signal is an original color image signal G or an image color difference signal Y.

6. The analog front end device according to claim 5, wherein the calibration unit utilizes the gain correction value to generate a control signal for adjusting a gain of the voltage buffer.

7. The analog front end device according to claim 5, wherein the calibration unit is implemented by software, firmware, hardware or any combination thereof.

8. An analog front end device for receiving N analog image signals (N is an integer and larger than 1) and generating N digital signals, the analog front end device comprising:
   N conversion circuits, each conversion circuit comprises:
   a clamper, receiving one of the N analog image signals, for clamping the DC level of the analog image signal, and generating a clamped signal;
   a multiplexer, receiving the clamped signal and a test signal, for selectively outputting the clamped signal or the test signal according to a selecting signal;
   an voltage buffer, for buffering the clamped signal or the test signal to generate a buffered output signal; and
   an analog-to-digital converter, for perforating analog to digital conversion on the buffered output signal to generate one of the N digital signals; and
   a calibration unit generates a gain correction value according to the test signal and the N digital signals so as to calibrate the gain value of the digital signal,
   wherein the analog image signal is an original color image signal (R,G,B), an image color difference signal (Y,Pr, Pb), or a luminance chrominance signal (Y,C).

9. The analog front end device according to claim 8, wherein the calibration unit receives the N digital signals while all of the N multiplexers select the test signal for output; calculates the gain correction value of the other digital signals based on the current gain value of any single digital signal of the N digital signals; and utilizes the plurality of gain correction values to correct gain vlaues of the N digital signals while the N multiplexers select the N clamped signals for output.

10. The analog front end device according to claim 8, wherein the calibration unit utilizes the gain correction value to generate a control signal for adjusting a gain of the voltage buffer.

11. The analog front end device according to claim 8, wherein the test signal and the selecting signal are generated by a television system.

12. The analog front end device according to claim 8, wherein the test signal and the selecting signal are generated by the calibration unit.

13. The analog front end device according to claim 8, wherein the calibration unit is implemented by software, firmware, hardware, or any combination thereof.

14. The analog front end device according to claim 8, wherein the multiplexer selects the test signal for output according to the selecting signal when the analog front end device is operated under calibration mode.

15. The analog front end device according to claim 8, wherein the multiplexer selects the clamped signal for output according to the selecting signal when the analog front end device is operated under general mode.

16. The analog front end device according to claim 8, wherein the gain correction value is substantially equaly to a ratio of one digital signal to the other digital signal.

17. The analog front end device according to claim 8, wherein the gain correction value is an interpolation value.

* * * * *